(12) United States Patent
Yang et al.

(10) Patent No.: US 9,489,974 B2
(45) Date of Patent: *Nov. 8, 2016

(54) METHOD OF FABRICATING A BPM TEMPLATE USING HIERARCHICAL BCP DENSITY PATTERNS

(71) Applicant: SEAGATE TECHNOLOGY LLC, Cupertino, CA (US)

(72) Inventors: XiaoMin Yang, Livermore, CA (US); Shuaigang Xiao, Fremont, CA (US); Kim Y. Lee, Fremont, CA (US); Koichi Wago, Sunnyvale, CA (US); Philip Steiner, Los Altosc, CA (US)

(73) Assignee: Seagate Technology LLC, Cupertino, CA (US)

( * ) Notice: Subject to any disclaimer, the term of this patent is extended or adjusted under 35 U.S.C. 154(b) by 144 days.

This patent is subject to a terminal disclaimer.

(21) Appl. No.: 14/251,303

(22) Filed: Apr. 11, 2014

(65) Prior Publication Data

US 2015/0294680 A1 Oct. 15, 2015

(51) Int. Cl.
*G06F 7/00* (2006.01)
*G11B 5/855* (2006.01)
*G03F 7/00* (2006.01)

(52) U.S. Cl.
CPC .............. *G11B 5/855* (2013.01); *G03F 7/0002* (2013.01)

(58) Field of Classification Search
CPC .................................................. G03F 7/0002
See application file for complete search history.

(56) References Cited

U.S. PATENT DOCUMENTS

| | | | |
|---|---|---|---|
| 6,822,833 B2 | 11/2004 | Yang et al. | |
| 7,029,773 B2 | 4/2006 | van de Veerdonk et al. | |
| 7,041,394 B2 | 5/2006 | Weller et al. | |
| 7,344,773 B2 | 3/2008 | Subramanya et al. | |
| 7,351,445 B2 | 4/2008 | Haginoya et al. | |
| 7,416,991 B2 | 8/2008 | Bandic et al. | |
| 7,622,367 B1 | 11/2009 | Nuzzo et al. | |
| 7,790,350 B2 | 9/2010 | Breyta et al. | |
| 7,964,107 B2 | 6/2011 | Millward | |
| 8,187,480 B2 | 5/2012 | Lee et al. | |
| 8,268,545 B2 | 9/2012 | Xiao et al. | |
| 9,079,216 B2 * | 7/2015 | Xiao ...................... | B05D 3/107 |
| 2002/0132083 A1 | 9/2002 | Weller et al. | |
| 2003/0091752 A1 | 5/2003 | Nealey et al. | |

(Continued)

FOREIGN PATENT DOCUMENTS

| | | |
|---|---|---|
| JP | 2007272962 | 10/2007 |
| JP | 2007301839 | 11/2007 |

(Continued)

OTHER PUBLICATIONS

Miller et al., "Step and Flash Imprint Process Integration Techniques for Photonic Crystal Patterning: Template Replication through Water Patterning Irrespective of Tone", Advanced Fabrication Technologies for Micro/Nano Optics and Photonics, Proceedings vol. 6883, Feb. 2008.

*Primary Examiner* — James M Mellott

(57) ABSTRACT

The embodiments disclose a method including patterning a template substrate to have different densities using hierarchical block copolymer density patterns in different zones including a first pattern and a second pattern, using a first directed self-assembly to pattern a first zone in the substrate using a first block copolymer material, and using a second directed self-assembly to pattern a second zone in the substrate using a second block copolymer material.

12 Claims, 14 Drawing Sheets

(56) References Cited

U.S. PATENT DOCUMENTS

| | | |
|---|---|---|
| 2003/0091865 A1 | 5/2003 | Chen et al. |
| 2003/0194582 A1 | 10/2003 | Ishikawa et al. |
| 2004/0071924 A1 | 4/2004 | Yang et al. |
| 2006/0222898 A1 | 10/2006 | Ichihara |
| 2008/0102252 A1 | 5/2008 | Black et al. |
| 2008/0176749 A1 | 7/2008 | Giyal |
| 2008/0299353 A1 | 12/2008 | Slykovich et al. |
| 2009/0087664 A1 | 4/2009 | Nealey et al. |
| 2009/0196488 A1 | 8/2009 | Nealey et al. |
| 2009/0260750 A1 | 10/2009 | Nealey et al. |
| 2009/0308837 A1* | 12/2009 | Albrecht ................ G11B 5/855 216/22 |
| 2010/0124629 A1 | 5/2010 | Gopalan et al. |
| 2010/0124638 A1 | 5/2010 | Xiao et al. |
| 2010/0165512 A1 | 7/2010 | Albrecht et al. |
| 2010/0178615 A1 | 7/2010 | Colburn et al. |
| 2012/0107583 A1 | 5/2012 | Xiao et al. |
| 2012/0196094 A1* | 8/2012 | Xu ........................ G11B 5/746 428/195.1 |
| 2013/0189504 A1* | 7/2013 | Nealey .................. B82Y 30/00 428/201 |
| 2013/0266780 A1 | 10/2013 | Ellison et al. |

FOREIGN PATENT DOCUMENTS

| | | |
|---|---|---|
| JP | 2008016071 | 1/2008 |
| JP | 2009193636 | 8/2009 |
| JP | 2010123239 | 6/2010 |
| JP | 2011523376 | 8/2011 |
| WO | 04001756 | 12/2003 |
| WO | 2006118677 | 11/2006 |

* cited by examiner

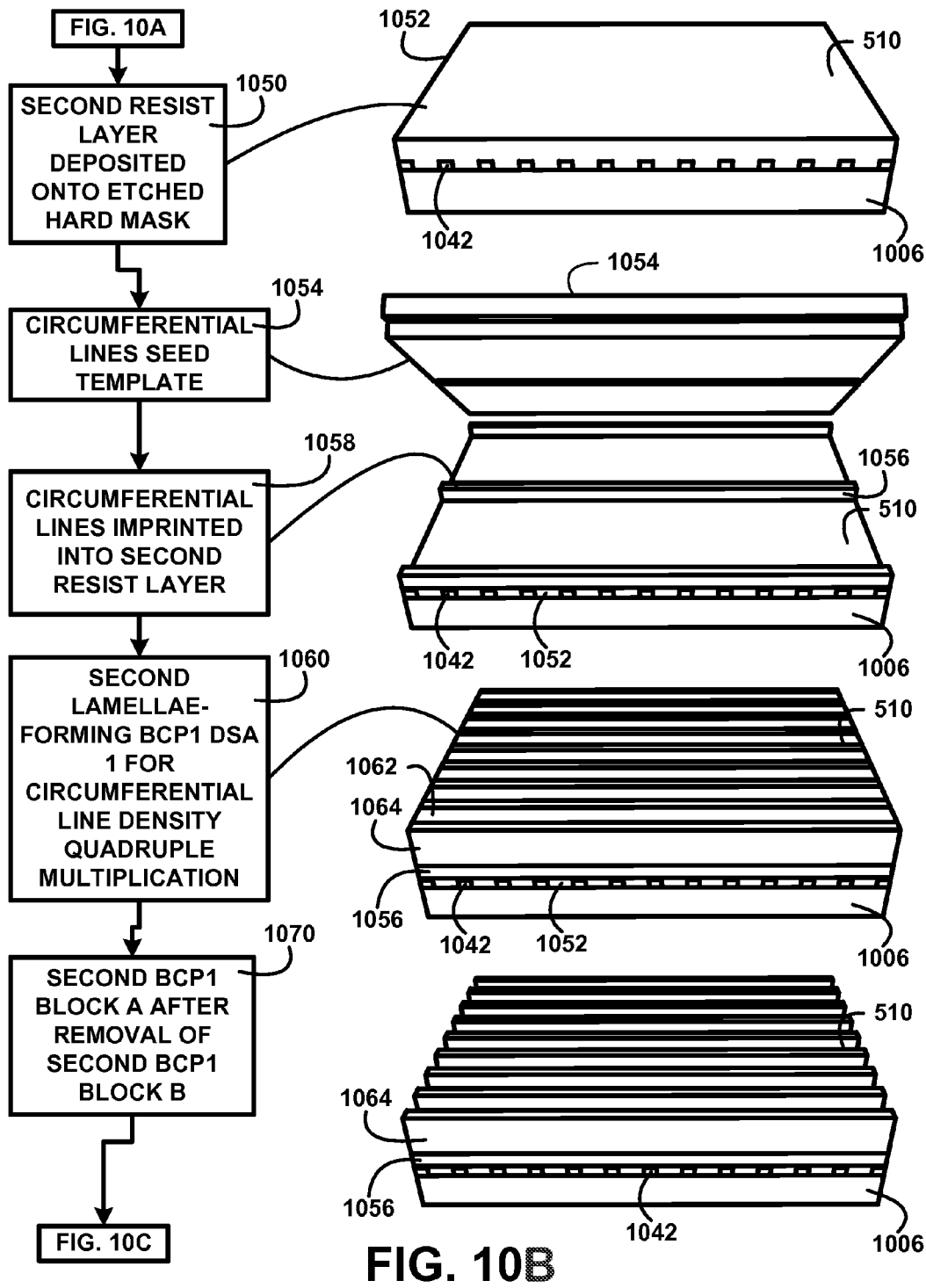

METHOD OF FABRICATING A BPM TEMPLATE USING HIERARCHICAL BCP DENSITY PATTERNS

BRIEF DESCRIPTION OF THE DRAWINGS

FIG. 10B shows for illustrative purposes only an example of a data zone 2-D rectangular bit density with circumferential lines pattern of one embodiment.

DETAILED DESCRIPTION OF THE INVENTION

In a following description, reference is made to the accompanying drawings, which form a part hereof, and in which is shown by way of illustration a specific example in which the invention may be practiced. It is to be understood that other embodiments may be utilized and structural changes may be made without departing from the scope.

General Overview:

It should be noted that the descriptions that follow, for example, in terms of a method of fabricating a BPM template using hierarchical BCP density patterns is described for illustrative purposes and the underlying system can apply to any number and multiple types BPM patterns. In one embodiment, the method of fabricating a BPM template using hierarchical BCP density patterns can be configured using directed self-assembly. The a method of fabricating a BPM template using hierarchical BCP density patterns can be configured to include 2-D dots array pattern is used in data zone and can be configured to include 1-D trench pattern is used in servo zone using the present invention.

Figure 1:
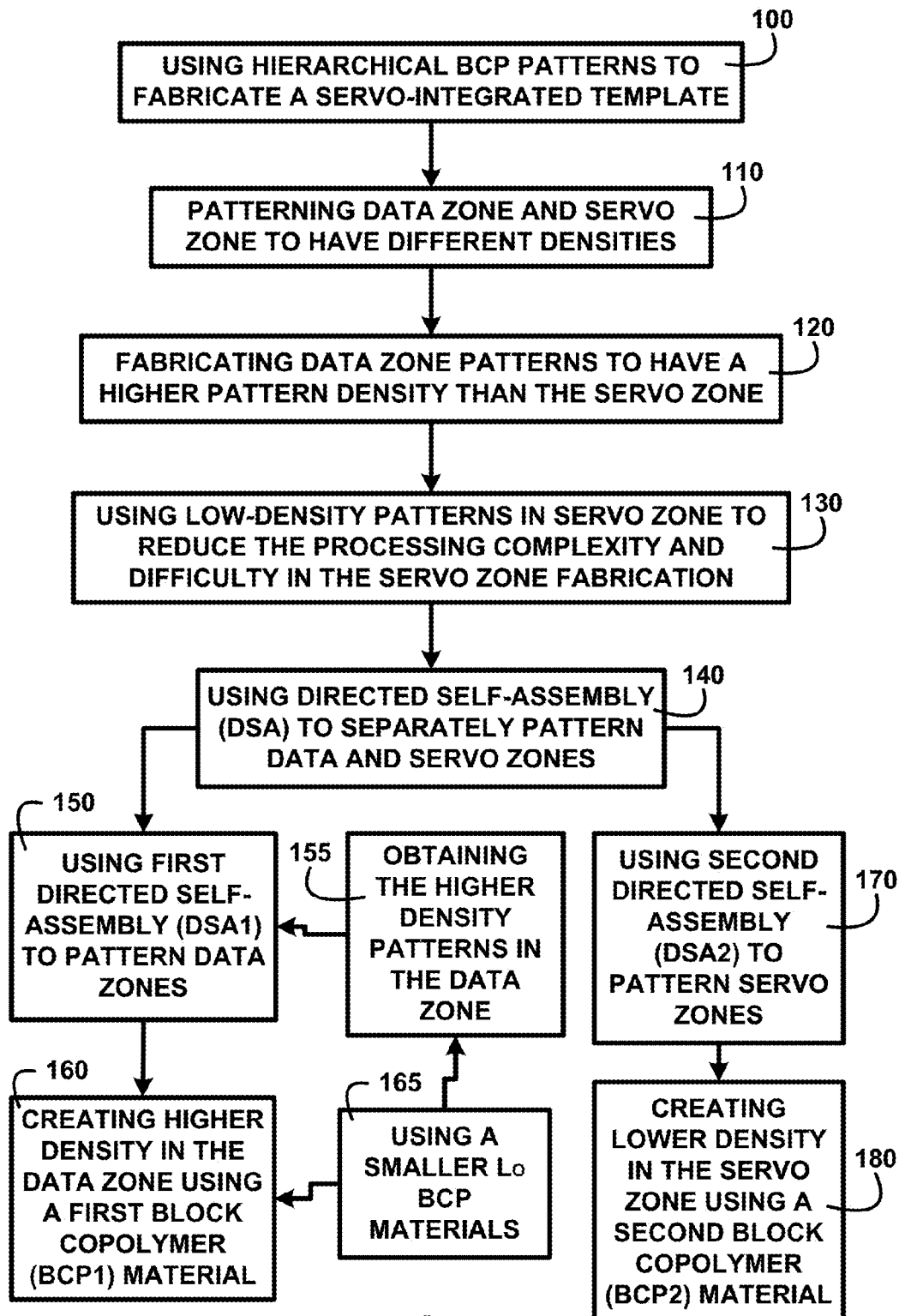
FIG. 1 shows a block diagram of an overview of a method of fabricating a BPM template using hierarchical BCP density patterns of one embodiment.

FIG. 1 shows a block diagram of an overview of a method of fabricating a BPM template using hierarchical BCP density patterns of one embodiment. The method of fabricating a BPM template using hierarchical BCP density patterns includes patterning a template substrate to have different densities using hierarchical block copolymer density patterns in different zones. The template substrate patterning includes bit patterned media (BPM). The patterning includes processes including directed self-assembly (DSA) and using materials including block copolymers (BCP).

In one embodiment the method is using first directed self-assembly to pattern a first zone in the substrate using a first block copolymer material. The first zone includes zones including data zones. In one embodiment a pattern in the first zone includes a two dimensional (2-D) dots array pattern. In one embodiment a pattern in the second zone includes a one dimensional (1-D) trench pattern. In one embodiment the second zone includes zones including a servo zone.

FIG. 1 shows using hierarchical BCP patterns to fabricate a servo-integrated template 100. Hierarchical BCP patterns include patterning data zone and servo zone to have different densities 110. Patterning data zone and servo zone to have different densities 110 allows fabricating data zone patterns to have a higher pattern density than the servo zone 120. Using low-density patterns in servo zone to reduce the processing complexity and difficulty in the servo zone fabrication 130 is another feature of hierarchical BCP patterns.

Using hierarchical BCP patterns allows using directed self-assembly (DSA) to separately pattern data and servo zones 140 including using first directed self-assembly (DSA1) to pattern data zones 150. Using first directed self-assembly (DSA1) to pattern data zones 150 is used for creating higher density in the data zone using a first block copolymer (BCP1) material 160 of one embodiment. Obtaining the higher density patterns in the data zone 155 is achieved using a smaller Lo BCP materials 165, where Lo is the natural periodicity. Another embodiment of the process includes using second directed self-assembly (DSA2) to pattern servo zones 170 for creating lower density in the servo zone using a second block copolymer (BCP2) material 180.

Detailed Description:

Block copolymers (BCP) are self-assembling polymeric materials used in nanolithography. Block copolymers feature spontaneous and directed self-assembly of the at least two blocks in the BCP deposited on substrate materials including low surface energy materials. The orientation and lateral ordering of BCP nano patterns is controllable using directed self-assembly in a guiding pattern created on the substrate materials. Nanolithography using directed self-assembly (DSA) of block copolymers (BCPs) generates laterally ordered, periodic arrays of self-assembled spheres, cylinders, or lamellae with a varying feature size.

The highly ordered self-assembled nano patterns can be used for lithographic masks for parallel line arrays or hexagonal/square dot arrays using various structure-directing surface patterns. Highly ordered nano patterns are anticipated using the surface chemical pattern period coordinated with the equilibrium period of the BCP self-assembled nanostructure.

Figure 2:
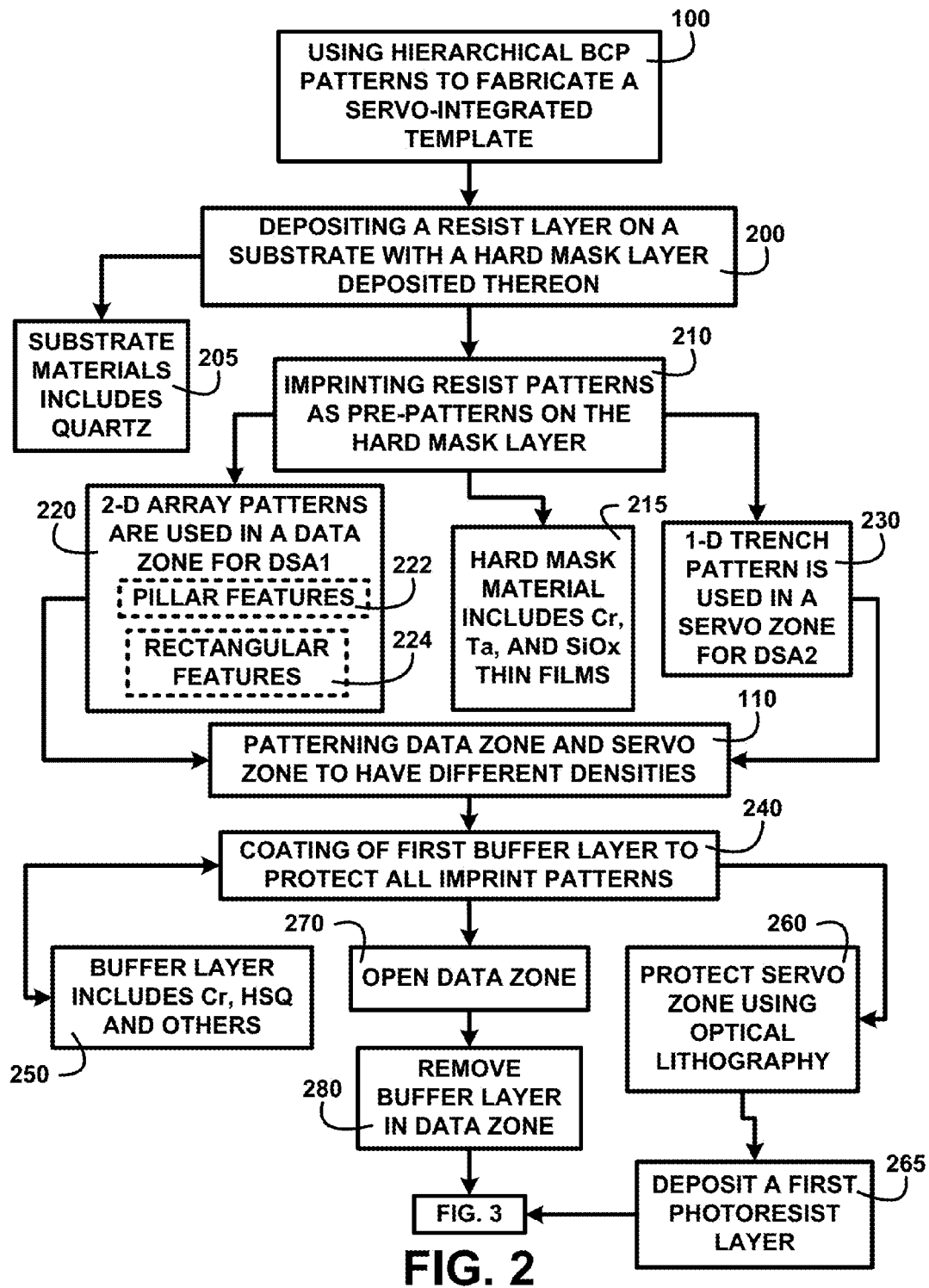
FIG. 2 shows a block diagram of an overview flow chart of a method of fabricating a BPM template using hierarchical BCP density patterns of one embodiment.

FIG. 2 shows a block diagram of an overview flow chart of a method of fabricating a BPM template using hierarchical BCP density patterns of one embodiment. FIG. 2 shows using hierarchical BCP patterns to fabricate a servo-integrated template 100. The fabrication process includes depositing a resist layer on a substrate with a hard mask layer deposited thereon 200. The substrate includes using substrate materials includes quartz 205.

An imprint resist is deposited on the hard mask layer. Patterning includes imprinting resist patterns as pre-patterns on the hard mask layer 210. The hard mask layer includes using hard mask material includes Cr, Ta, and SiOx thin films 215, where Cr is chromium, Ta is tantalum and SiOx is a silicon oxide.

Patterning in a first zone including a data zone includes a process where 2-d array patterns are used in a data zone for DSA1 220 including pillar features 222 and rectangular features 224. Patterning in a second zone including a servo zone includes a process where a 1-D trench pattern is used in a servo zone for DSA2 230. The DSA processes are used for patterning data zone and servo zone to have different densities 110.

A process is used for coating of first buffer layer to protect all imprint patterns 240 imprinted into a resist layer deposited on the hard mask. A buffer layer includes Cr, HSQ and others 250, where Cr is chromium and HSQ is hydrogen silsesquioxane. A process is used to protect servo zone using optical lithography 260 including depositing a first photoresist layer 265. Subsequently a process is used to open data zone 270 including a process to remove buffer layer in data zone 280 of one embodiment. Processing is continued in FIG. 3.

Figure 3:
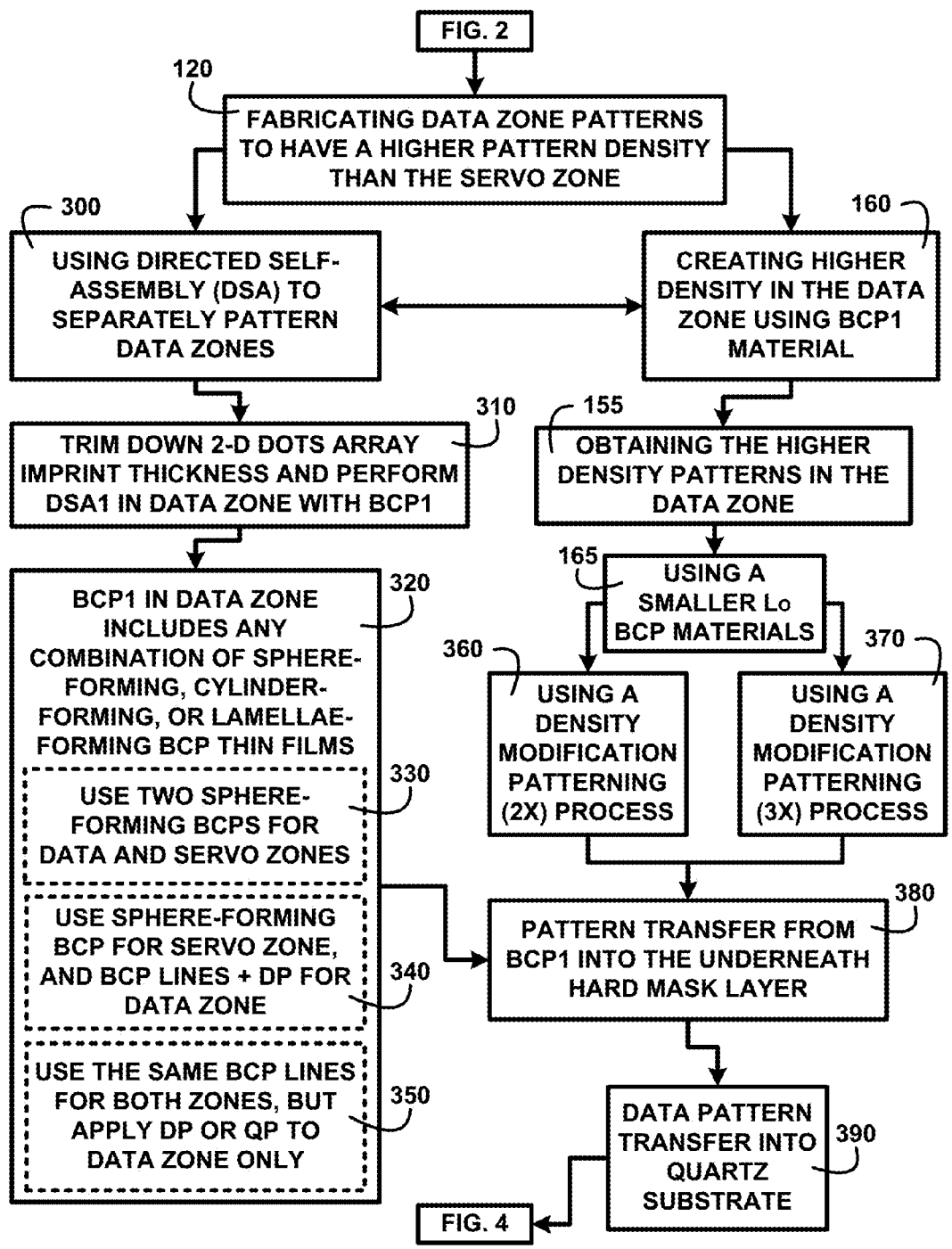
FIG. 3 shows a block diagram of an overview flow chart of fabricating data zone patterns of one embodiment.

FIG. 3 shows a block diagram of an overview flow chart of fabricating data zone patterns of one embodiment. FIG. 3 shows a continuation from FIG. 2 including fabricating data zone patterns to have a higher pattern density than the servo zone 120 using directed self-assembly (DSA) to separately pattern data zones 300. The fabrication includes a process to trim down 2-D dots array imprint thickness and perform DSA1 in data zone with BCP1 310. BCP1 in data zone includes any combination of sphere-forming, cylinder-forming, or lamellae-forming BCP thin films 320.

Block copolymers (BCP) involve the chemical linking of two or more polymer chains of different chemical species and these molecules self-assemble. Long-range ordering of a sphere-forming block copolymer is achieved using for example a sphere-forming polystyrene-bpoly(dimethylsiloxane) (PS-PDMS) BCP to make nanoscale dot arrays. A sphere-forming block copolymer can include two blocks including an inorganic component silicon (Si) in the PDMS. An ultra-violet light source can be used to cure the spheres. Cylinder forming BCPs include for example polystyrene-polymethyl methacrylate (PS-b-PMMA) block copolymer films that form cylinders that can be oriented perpendicular to the substrate to make nanoscale dot arrays. Lamellae-forming BCP thin films are used to form lines and that can include a thickness perpendicular to a substrate.

The combinations include for example a process to use two sphere-forming BCPs for data and servo zones 330, to use sphere-forming BCP for servo zone, but BCP lines+ Double Patterning (DP) for data zone 340 and to use the same BCP lines for both zones, but apply DP or Quadruple Patterning (QP) to data zone only 350 for creating higher density in the data zone using BCP1 material 160. The processes for obtaining the higher density patterns in the data zone 155 include using a smaller Lo BCP materials 165. Higher density patterns are achieved using DSA using BCP materials configured for using a density modification patterning (2×) process 360. Higher density patterns are achieved using DSA using BCP materials configured for using a density modification patterning (3×) process 370. In other embodiments density modification patterning processes are configured to use BCP materials and DSA for higher density increases greater than 3×. A pattern transfer from BCP1 into the underneath hard mask layer 380 is a precursor for a data pattern transfer into quartz substrate 390 to create a template.

Using a smaller Lo BCP materials 165 includes for data zone: Lo=25 nm lamellae-forming BCP->DP->12.5 nm lines->2 Td and above rectangular bits and for data zone: Lo=25 nm lamellae-forming BCP->DP or QP->12.5 nm lines->2 Td and above of one embodiment. Descriptions of processing continue in FIG. 4.

Figure 4:
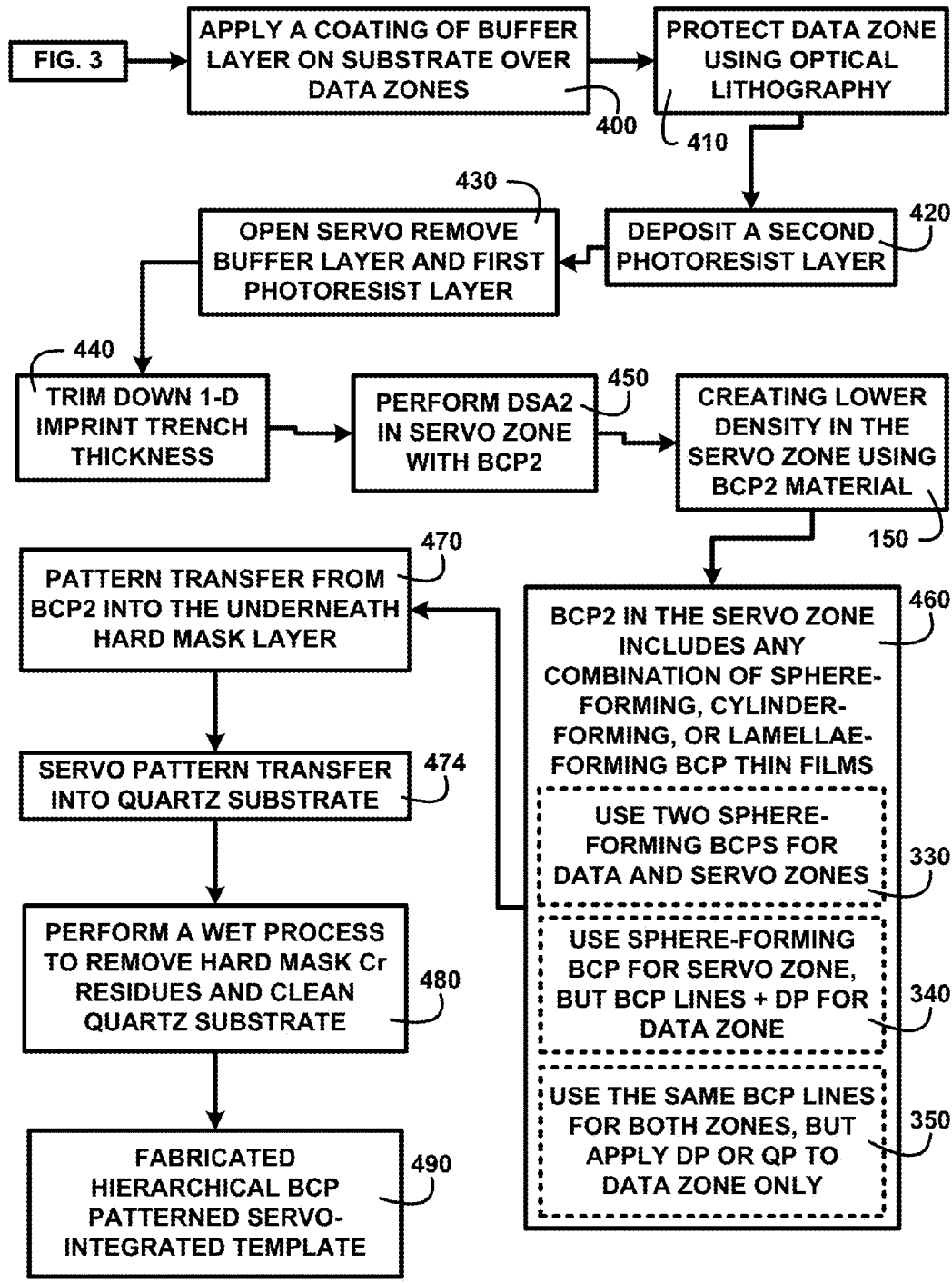
FIG. 4 shows a block diagram of an overview flow chart of creating lower density in the servo zone of one embodiment.

FIG. 4 shows a block diagram of an overview flow chart of creating lower density in the servo zone of one embodiment. FIG. 4 shows continuing from FIG. 3 a process to apply a coating of buffer layer on substrate over data zones 400. A process to protect data zone using optical lithography 410 includes a process to deposit a second photoresist layer 420.

A process is used to open servo remove buffer layer and first photoresist layer 430 in servo zones. A process is used to trim down 1-D imprint trench thickness 440 of the imprinted 1-D trench pattern in the servo zones. After the trimming process a process is used to perform DSA2 in servo zone with BCP2 450. BCP2 in the servo zone includes any combination of sphere-forming, cylinder-forming, or lamellae-forming BCP thin films 460.

The combinations include for example a combination to use two sphere-forming BCPs for data and servo zones 330, to use sphere-forming BCP for servo zone, but BCP lines+ DP for data zone 340 and to use the same BCP lines for both zones, but apply DP or QP to data zone only 350. A pattern transfer from BCP2 into the underneath hard mask layer and then into quartz substrate 470 includes for example a etch process. The fabrication continues to perform a wet process to remove hard mask Cr residues and clean quartz substrate 480. The wet process reveals a fabricated hierarchical BCP patterned servo-integrated template 490 of one embodiment.

Figure 5:
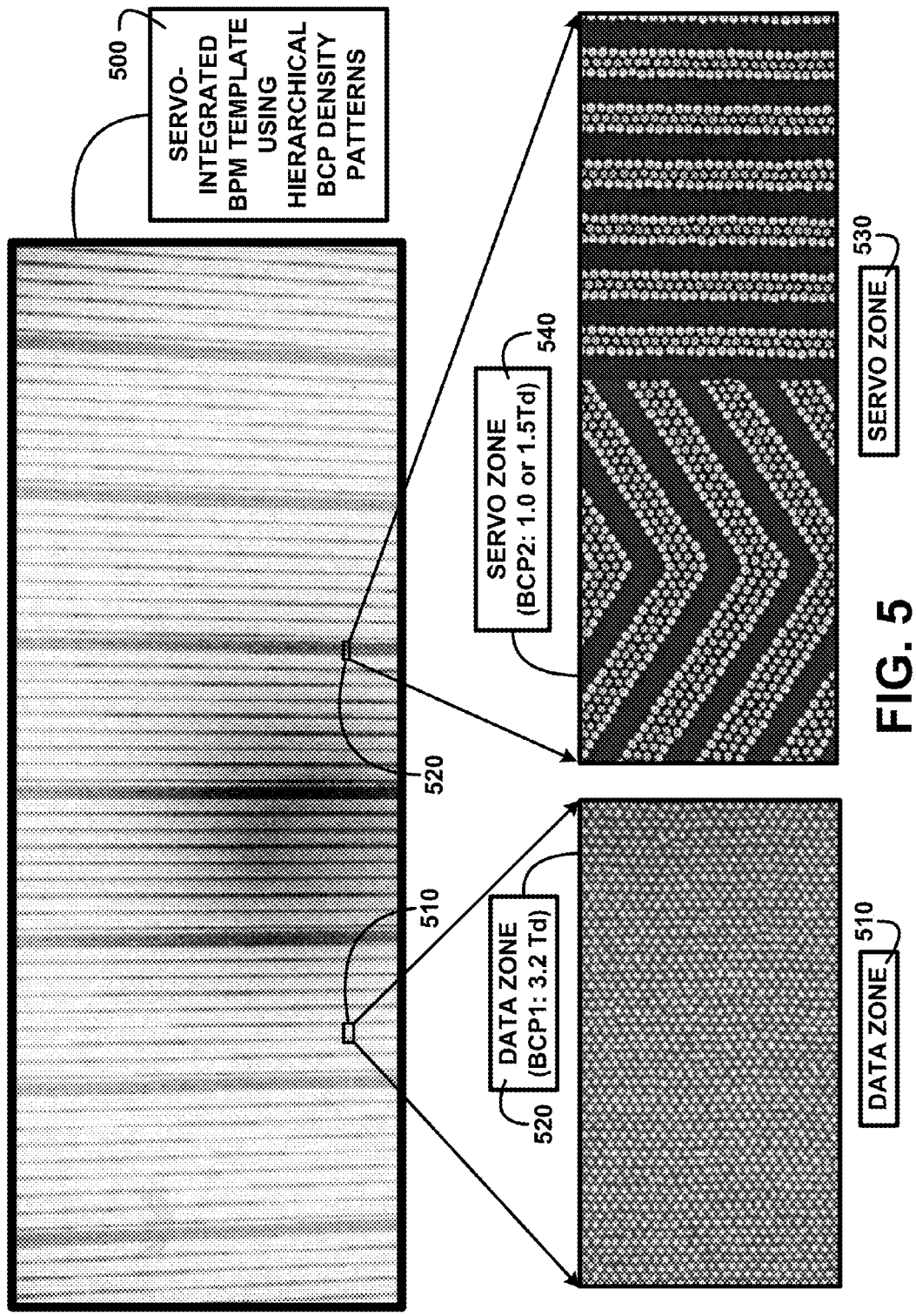
FIG. 5 shows for illustrative purposes only an example of hierarchical BCP density patterns of one embodiment.

FIG. 5 shows for illustrative purposes only an example of hierarchical BCP density patterns of one embodiment. FIG. 5 shows a servo-integrated BPM template using hierarchical BCP density patterns 500. A data zone 510 location is detailed to show a data zone (BCP1: 3.2 Td) 520. A servo zone 530 location is detailed to show servo zone (BCP2: 1.0 or 1.5 Td) 540. The data zone (BCP1: 3.2 Td) 520 shows a data zone pattern to have a higher pattern density than the servo zone. The higher pattern density was created using first directed self-assembly (DSA1) to pattern data zones 150 of FIG. 1 using a first block copolymer (BCP1) material 160 of FIG. 1 of one embodiment.

Figure 6:
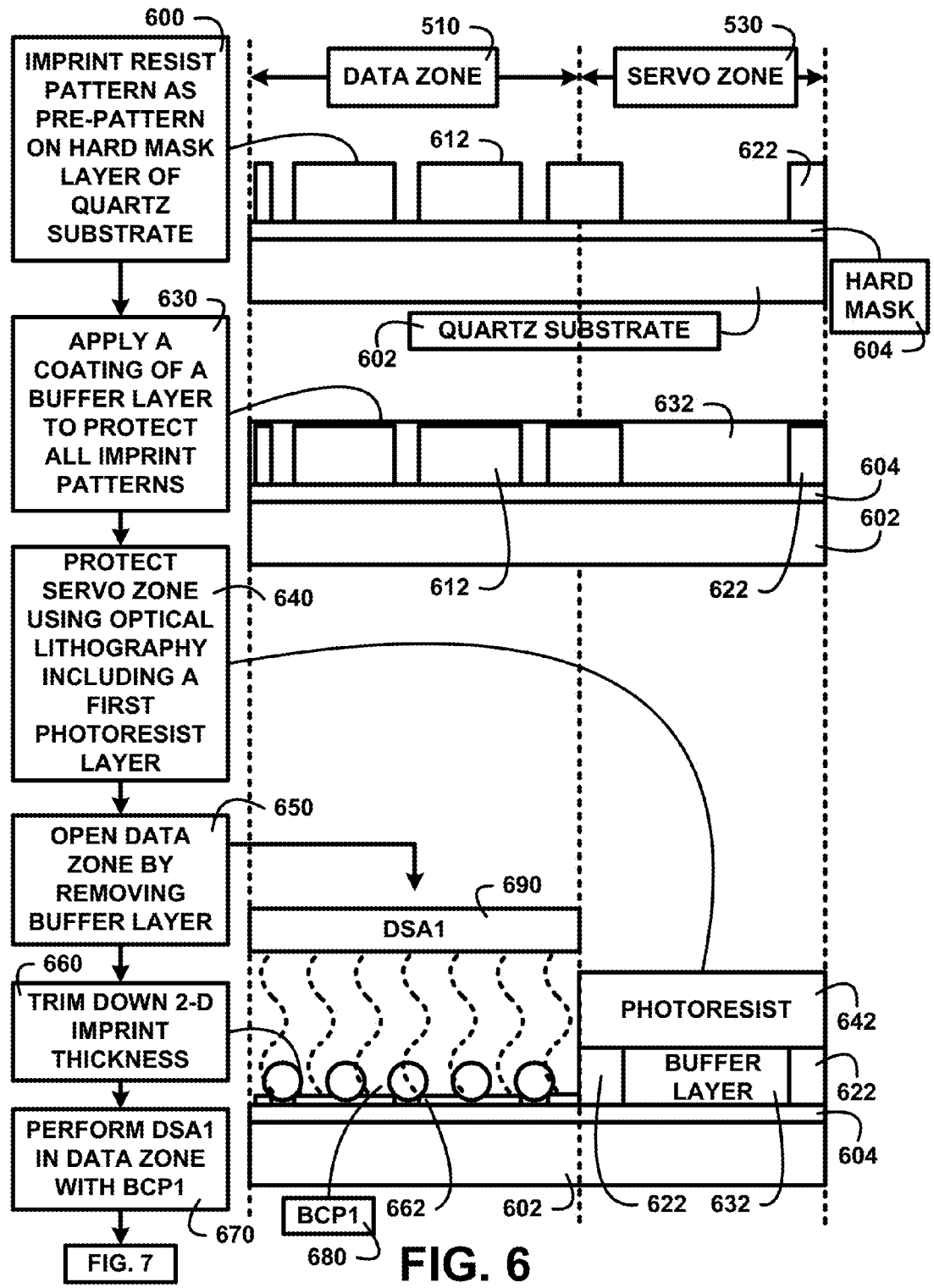
FIG. 6 shows for illustrative purposes only an example of imprint resist pattern as pre-pattern on hard mask of one embodiment.

FIG. 6 shows for illustrative purposes only an example of imprint resist pattern as pre-pattern on hard mask of one embodiment. FIG. 6 shows an imprint resist pattern as pre-pattern on hard mask layer of quartz substrate 600. The imprint resist pattern is imprinted into a resist layer deposited on the data and servo zones of the quartz substrate.

Two different patterns are imprinted in the data zone 510 and servo zone 530. The data zone 510 is imprinted with a 2-D imprint pattern 612. The 2-D imprint pattern 612 includes in one embodiment a 2-D dots array pattern used to pattern dots as a BPM magnetic feature. In another embodiment the 2-D imprint pattern 612 includes a 2-D lamellae lines pattern used to pattern rectangular bits as a BPM magnetic feature.

The servo zone 530 is imprinted with a 1-D imprint pattern 622. The 1-D imprint pattern 622 is used to pattern servo features within the servo zone 530. The servo features includes a number of features include straight lines, chevron lines and including other shapes to guide a DSA of magnetic features including dots between the 1-D imprint pattern 622 servo features. For example magnetic features including dots are formed at a lower density relative to the data zone 510 final densities after the DSA1 processes in the data zone 510. The higher pattern density in the data zone 510 includes for example 3.2 terabits per square inch (Td) where the corresponding servo zone 530 pattern density includes for example 1.0 or 1.5 Td. The lower density in the servo zone 530 is used to reduce the processing complexity and difficulty in the servo zone fabrication 130.

The resist layer is deposited on a hard mask 604 that has been deposited on the substrate including a quartz substrate 602. The substrate includes other materials for example silicon and glass. The hard mask 604 includes materials for example Cr, Ta, and SiOx thin films deposited on the quartz substrate 602. After the resist layer has been imprinted using the 2-D imprint pattern 612 in the data zone 510 and 1-D imprint pattern 622 in the servo zone 530 a process is used to apply a coating of a buffer layer to protect all imprint patterns 630.

The protection includes protecting the imprinted patterns during subsequent DSA processing. The buffer layer 632 includes using materials deposited on the imprinted features including Cr, HSQ and others. In addition to the protection of the buffer layer 632 a process is used to protect servo zone using optical lithography including a first photoresist layer 640. A first photoresist 642 layer protects the servo zone 530 to avoid damage to the imprinted servo features from DSA process that include for example curing process of the BCP1 and chemical removal of one of the blocks of the copolymer.

A process is used after the deposition of the first photoresist 642 layer to open data zone by removing buffer layer 650 over the data zone 510. A process is used to trim down 2-D imprint thickness 660 to lessen the height of the 2-D imprinted features. The processing continues to perform DSA1 in data zone with BCP1 670. The DSA1 690 process selectively removes one of the blocks of the BCP1 680 after the BCP1 organizes into separate blocks as guided by the imprinted 2-D pattern of one embodiment. Processing that continues is described in FIG. 7.

Figure 7:
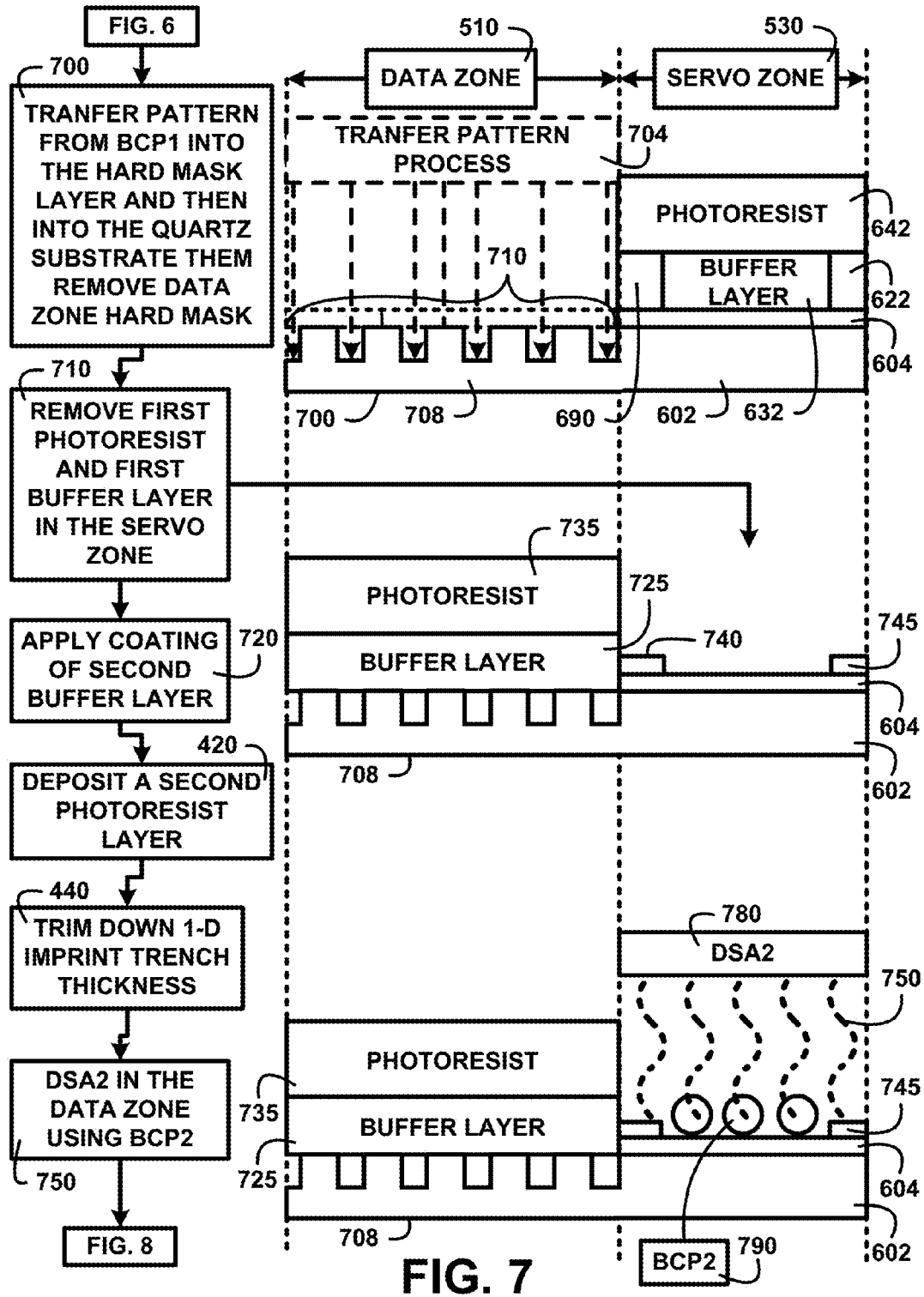
FIG. 7 shows for illustrative purposes only an example of transfer pattern from BCP1 of one embodiment.

FIG. 7 shows for illustrative purposes only an example of transfer pattern from BCP1 of one embodiment. FIG. 7 shows a continuation from FIG. 6. Shown in FIG. 7 is a process to transfer pattern from BCP1 into the hard mask layer and then into the quartz substrate them remove data zone hard mask 700. The pattern being transferred into the hard mask 604 is the higher density pattern created using the DSA1.

The DSA1 processing includes using a predefined process to increase the data zone 510 pattern density 4 times that of the imprinted pattern. The data zone 510 of the quartz substrate 602 is patterned using the transfer pattern process 704. The transfer pattern process 704 includes for example an etch process to etch the higher pattern into the hard mask 604. An additional process in the transfer pattern process 704 include for example an etch process to transfer the higher density pattern transferred into the hard mask 604 to the quartz substrate 602.

After the transfer of the higher density pattern into the substrate a process is used to apply coating of second buffer layer 720. A second buffer layer 720 is applied over the patterned data zone section of substrate 708. On top of the second buffer layer 720 a process is used to deposit a second photoresist layer 420 including a second photoresist layer 735.

In the servo zone 530 a process is used to remove first photoresist and first buffer layer in the servo zone 710. After the removal of the first photoresist and first buffer layer in the servo zone 710 a process is used to trim down 1-D imprint trench thickness 440 to a trimmed 1-D imprint trench 745. After the trimming process a DSA2 in the servo zone using BCP2 750 is performed. The DSA2 780 uses the BCP2 790 to build the magnetic features patterns in the servo zone for later transfer into the substrate of one embodiment. Descriptions of further processing are in FIG. 8.

Figure 8:
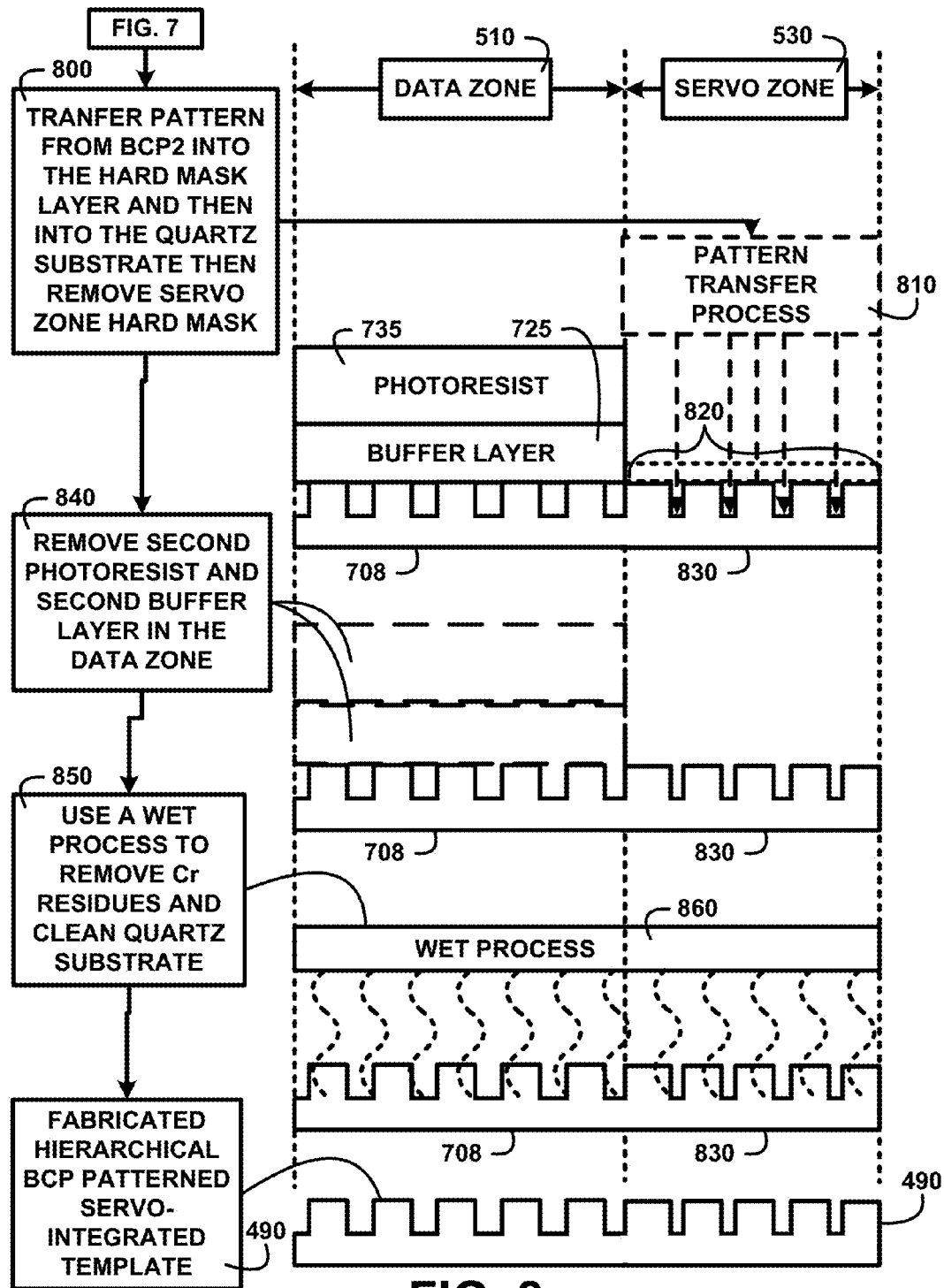
FIG. 8 shows for illustrative purposes only an example of transfer pattern from BCP2 of one embodiment.

FIG. 8 shows for illustrative purposes only an example of transfer pattern from BCP2 of one embodiment. FIG. 8 shows processing continuing from FIG. 7 including the transfer pattern from BCP2 into the hard mask layer and then into the quartz substrate then remove servo zone hard mask 800 in the servo zone 530. A pattern transfer process 810 is used to make a servo zone pattern transfer 820 of the DSA2 patterning process created servo features.

The substrate now includes the patterned data zone section of substrate 708 and servo zone patterned substrate 830. A process is used in the data zone 510 to remove the second buffer layer 725 and second photoresist layer 735. After the process is complete to remove second photoresist and second buffer layer in the data zone 840 the processing is configured to use a wet process to remove Cr residues and clean quartz substrate 850. The wet process 860 complete reveals the fabricated hierarchical BCP patterned servo-integrated template 490 of one embodiment.

Figure 9A:
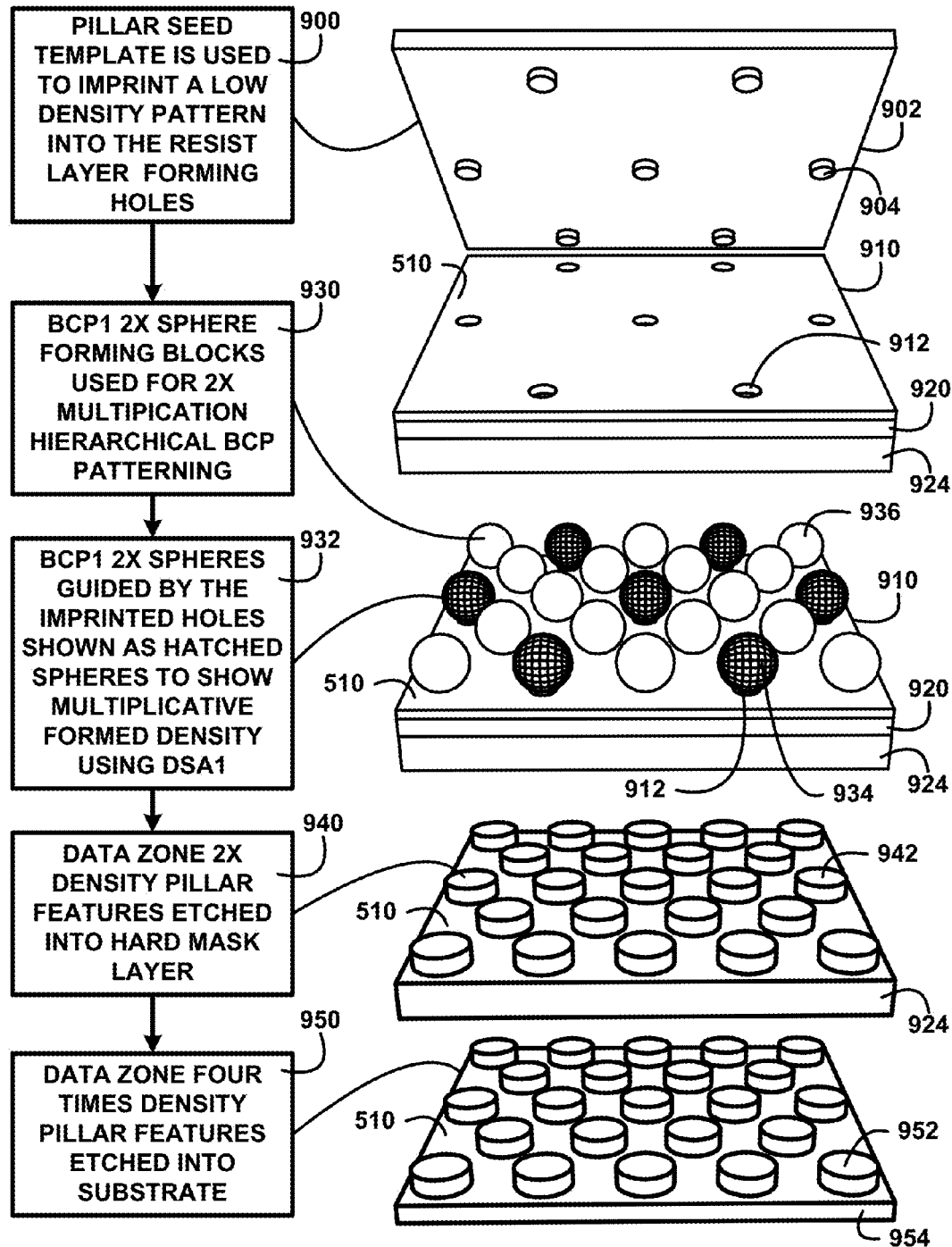
FIG. 9A shows for illustrative purposes only an example of a data zone 2-D pillar array 2× density multiplication pattern of one embodiment.

FIG. 9A shows for illustrative purposes only an example of a data zone 2-D pillar array 2× density multiplication pattern of one embodiment. FIG. 9A shows a substrate 924, hard mask layer 920 and resist layer 910 in the data zone 510. A pillar seed template is used to imprint a low density pattern into the resist layer forming holes 900. A pillar seed template 902 includes low density pillar seed template pattern feature 904 raised pillars used for forming holes.

The holes formed are used to guide a deposition on the imprinted resist layer of BCP1 in DSA1. BCP1 2× sphere forming blocks used for 2× multipication hierarchical BCP patterning 930 orient to the low density pattern. BCP1 2× spheres guided by the imprinted holes shown as hatched spheres to show multiplicative formed density using DSA1 932. A BCP1 2× sphere on hole 934 is attracted to a low density resist pattern hole 912 and anchoring a position for orientation of BCP1 2× sphere DSA1 936 features.

A non-sphere forming block of BCP1 2× is removed and an etch process is used to transfer data zone 2× density pillar features etched into hard mask layer 940. A plurality of hard mask 2× pillar feature 942 is formed in the hard mask layer on the substrate. A second etch process is used to transfer data zone four times density pillar features etched into substrate 950. FIG. 9A shows a plurality of substrate 2× pillar feature 952 in a data zone 2× pillar bit patterned substrate 954 to create an embodiment of fabricating a BPM template using hierarchical BCP density patterns.

Figure 9B:
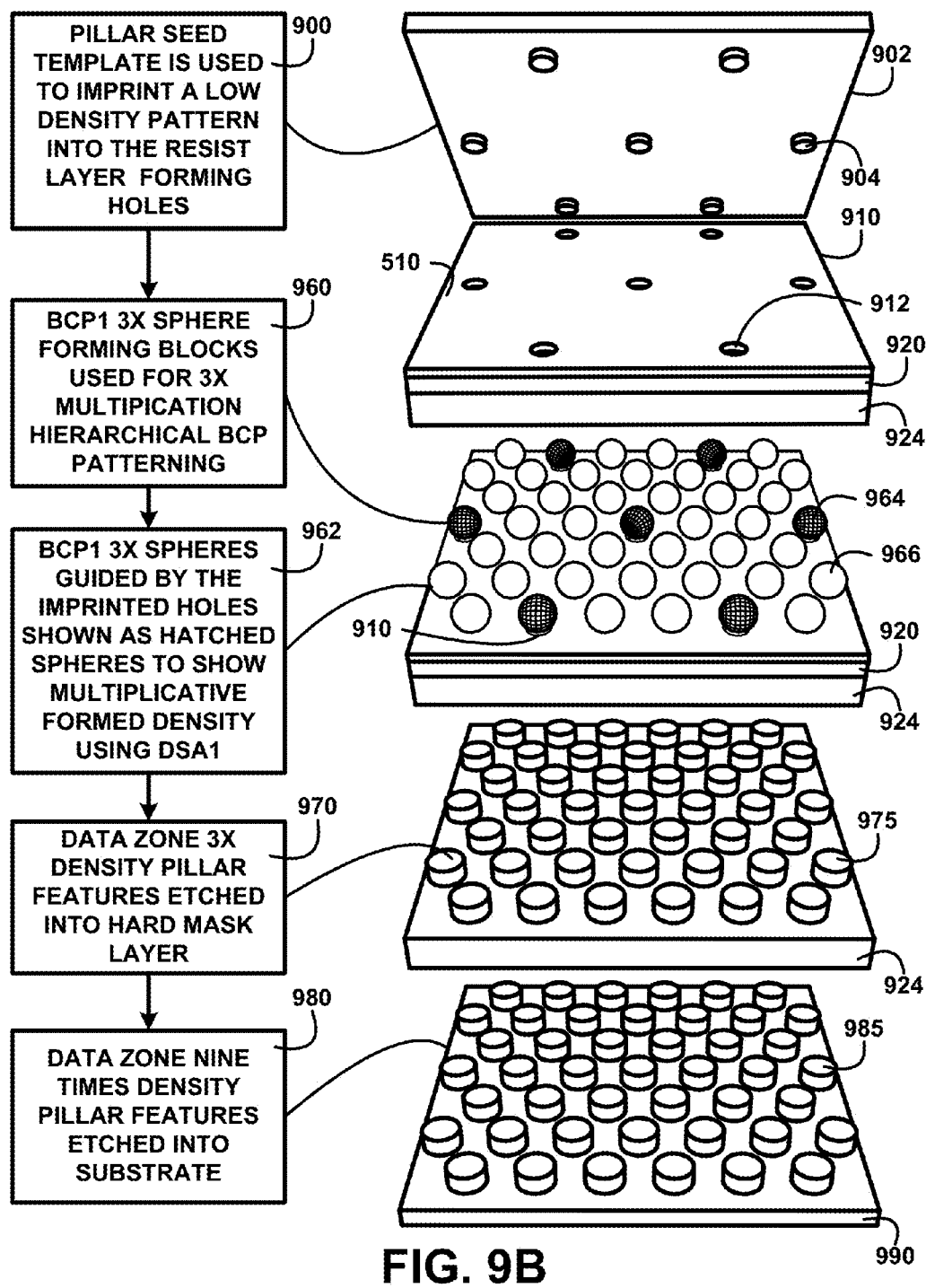
FIG. 9B shows for illustrative purposes only an example a data zone 2-D pillar array 3× density multiplication pattern of one embodiment.

FIG. 9B shows for illustrative purposes only an example a data zone 2-D pillar array 3× density multiplication pattern of one embodiment. FIG. 9B shows substrate 924, hard mask layer 920 and resist layer 910 in the data zone 510. The pillar seed template is used to imprint a low density pattern into the resist layer forming holes 900. The pillar seed template 902 includes the low density pillar seed template pattern feature 904 used to form the low density resist pattern hole 912.

A deposition of BCP1 3× sphere forming blocks used for 3× multipication hierarchical BCP patterning 960 is made on the imprinted resist. The low density pattern feature guide a BCP1 3× sphere on hole 964. BCP1 3× spheres guided by the imprinted holes shown as hatched spheres to show multiplicative formed density using DSA1 962. The orientation of the 2× lower Lo self-assembling sphere blocks are shown in the plurality of BCP1 3× sphere DSA1 966 features.

The non-spherical block is removed and data zone 3× density pillar features etched into hard mask layer 970. A plurality of hard mask 3× pillar feature 975 are processed for data zone nine times density pillar features etched into substrate 980. The raised substrate 3× pillar feature 985 is shown on a data zone 3× pillar bit patterned substrate 990 in one embodiment.

Figure 10A:
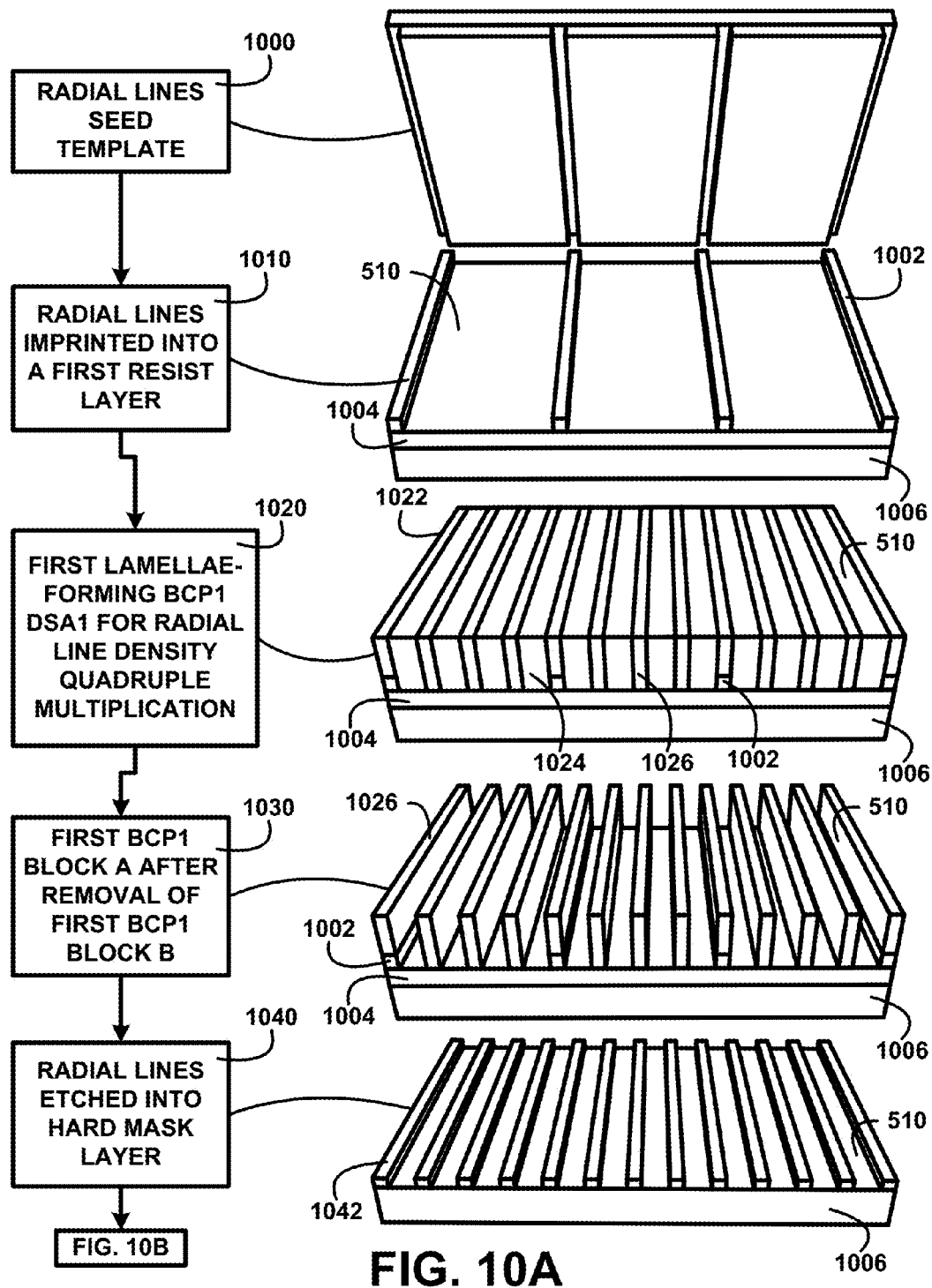
FIG. 10A shows for illustrative purposes only an example of a data zone 2-D rectangular bit density radial lines pattern of one embodiment.
Figure 10C:
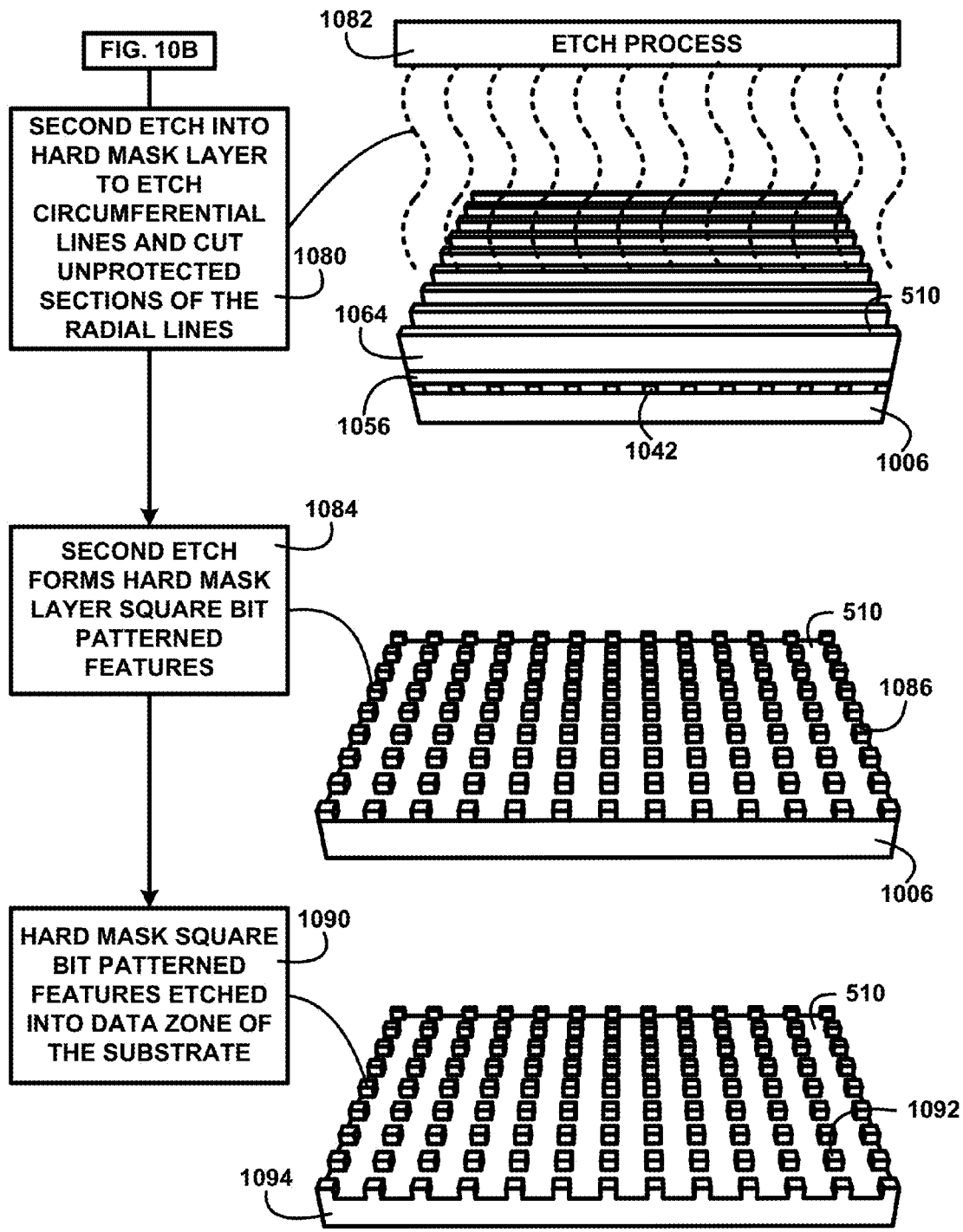
FIG. 10C shows for illustrative purposes only an example of a data zone density rectangular bit patterned template of one embodiment.

It should be noted that the lines shown in FIG. 10A, 10B and 10C are shown as straight lines for ease of illustration but are curved circumferential lines and angled radial lines. FIG. 10A shows for illustrative purposes only an example of a data zone 2-D rectangular bit density multiplication radial lines pattern of one embodiment. FIG. 10A shows a substrate 1006, hard mask layer 1004 and a first resist layer. A radial lines seed template 1000 is used to form radial lines imprinted into a first resist layer 1010. The radial lines seed template 1000 imprints radial line 1002 features in the data zone 510. In one embodiment a deposition on the imprinted resist is made using first lamellae-forming BCP1 1022. A first lamellae-forming BCP1 DSA1 for radial line density 1020 is used to increase the number of radial lines. DSA1 forms first BCP1 Block B 1024 and first BCP1 Block A 1026 features. FIG. 10A shows first BCP1 Block A after removal of first BCP1 Block B 1030. Using an etch process radial lines etched into hard mask layer 1040 forming a plurality of hard mask etched radial line 1042 features of one embodiment. Descriptions of continuing process are in FIG. 10B.

FIG. 10B shows for illustrative purposes only an example of a data zone 2-D rectangular bit density circumferential lines pattern of one embodiment. FIG. 10B shows continuing from FIG. 10A a second resist layer 1052 deposited on the hard mask etched radial line 1042 features on the substrate 1006 in the data zone 510. A second resist layer deposited onto etched hard mask 1050 is used for imprinting circumferential lines. A circumferential lines seed template 1054 is used where circumferential lines imprinted into second resist layer 1058 are positioned in an alignment process to cross the radial lines.

A second lamellae-forming BCP1 DSA 1 for circumferential line density 1060 is used to form a second BCP1 Block B 1062 and a second BCP1 Block A 1064. The self-assembly is guided by resist imprinted circumferential line 1056 features. Shown is a second BCP1 Block A after removal of second BCP1 Block B 1070. The second BCP1 Block A 1064 features are used to process hard mask etched radial line 1042 as described in FIG. 10C of one embodiment.

FIG. 10C shows for illustrative purposes only an example of a data zone density rectangular bit patterned template of one embodiment. FIG. 10C shows continuing from FIG. 10B a second etch into hard mask layer to etch circumferential lines and cut unprotected sections of the radial lines 1080. An second etch process 1082 uses resist imprinted circumferential line 1056 and second BCP1 Block A 1064 features to mask and protect sections of the plurality of hard mask etched radial line 1042 features. A second etch forms hard mask layer square bit patterned features 1084.

A subsequent etch for example plasma etching transfers hard mask square bit patterned features 1086 into the substrate 1006. The transfer produces hard mask square bit patterned features etched into data zone of the substrate 1090 is used to fabricate a high-density rectangular bit BPM template using cross-DSA process.

As the line width is getting smaller and smaller narrow imprinted resist collapses. The high-density rectangular bit BPM template using cross-DSA process avoids a narrow imprint resist process since there is no high-resolution line imprint step involved. The cross-DSA process is induced by imprint resist pattern, not e-beam lithography. The imprint-induced DSA provides a flexible choice to various substrates including conducting, semiconducting, or non-conducting materials, such as Si, quartz, carbon layer, Cr, Ta and so on. When using e-beam lithography, the substrate has be conducting or semiconducting materials, such as Si.

The cross-DSA step is a two-step DSA process with two low-density imprint templates. One step is the circumferential lines and other step is the radial lines. The order of two imprint processes can be reversed. The two-step DSA process will be done on the same substrate.

BCP will do density multiplication, such as 2×, 3×, and so on. The BCP materials or the morphology in two DSA processes can be different. Data zone: Lo=25 nm lamellae-forming BCP->DP->12.5 nm lines->2 Td and above rectangular bits. Data zone: Lo=25 nm lamellae-forming BCP->DP or QP->12.5 nm lines->2 Td and above. For example, one DSA is to use PS-b-PMMA BCP material, and other is to use PS-b-PDMS BCP material. Moreover, the DSA lines can be different morphology BCPs, such as lamellae-forming BCP or cylinder-forming BCP. Substrate square bit patterned features 1092 populate a data zone patterned substrate 1094 to form an embodiment of fabricating a BPM template using hierarchical BCP density patterns.

Figure 11:
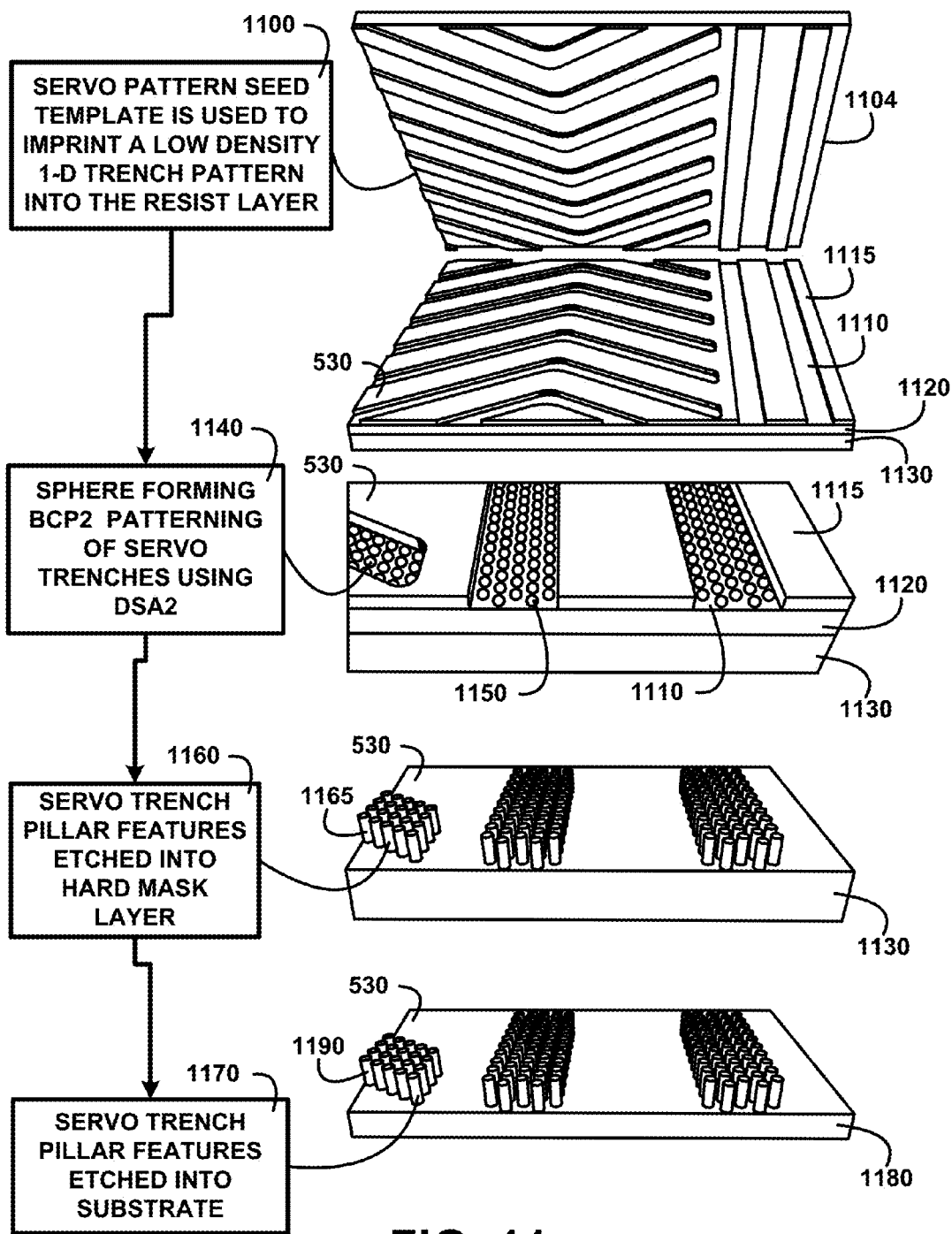
FIG. 11 shows for illustrative purposes only an example of a servo zone 1-D trench pattern of one embodiment.

FIG. 11 shows for illustrative purposes only an example of a servo zone 1-D trench pattern of one embodiment. FIG. 11 shows a substrate 1130, hard mask layer 1120 and a resist seed layer 1110. A servo pattern seed template is used to imprint a low density 1-D trench pattern into the resist layer 1100 in the servo zone 530. A servo pattern seed template 1104 imprints various servo DSA guiding line pattern 1115 features into the resist seed layer 1110.

A sphere forming BCP2 patterning of servo trenches using DSA2 1140 is used to form a plurality of spheres in the servo trenches. The spacing of the spheres is guided by the servo DSA guiding line pattern 1115. The spheres are shown after removal of the non-spherical BCP2 block. An etch process is used to form a plurality of servo pillar bit feature 1180 into the hard mask. Servo trench pillar features etched into hard mask layer 1160 are formed using the BCP2 sphere to mask the etch.

A subsequent etch is used to transfer servo trench pillar features etched into substrate 1170. A hard mask etched pillar bit feature 1165 mask the etch into the substrate 1130. A plurality of servo pillar bit feature 1190 structures populate the servo trench locations on a servo pillar bit feature etched substrate 1180 of one embodiment.

The foregoing has described the principles, embodiments and modes of operation. However, the invention should not be construed as being limited to the particular embodiments discussed. The above described embodiments should be regarded as illustrative rather than restrictive, and it should be appreciated that variations may be made in those embodiments by workers skilled in the art without departing from the scope as defined by the following claims.

What is claimed is:

1. A method, comprising:
   patterning a template substrate to have different densities using hierarchical block copolymer density patterns in a first zone and a second zone of the template including a first pattern and a second pattern;

applying a coating of a first buffer layer and a first photoresist layer to the second zone;

subsequent to the applying, using a first directed self-assembly to pattern the first zone in the substrate with a first pattern using a first block copolymer material to form an imprinted first pattern; and using a second directed self-assembly to pattern the second zone in the substrate with a second pattern using a second block copolymer material to form an imprinted second pattern.

2. The method of claim 1, wherein the template substrate includes a servo-integrated template including at least one first zone including a data zone and including at least one second zone including a servo zone, wherein a density of the data zone array is at least twice a density of the servo zone.

3. The method of claim 1, wherein the hierarchical block copolymer density patterns in different zones includes the first zone has a pattern having a higher pattern density than a second zone pattern.

4. The method of claim 1, wherein the first block copolymer material and the second block copolymer material include any combination of sphere-forming, cylinder-forming, or lamellae-forming BCP thin films.

5. The method of claim 1, wherein the first pattern includes a two dimensional dots array pattern and the second pattern includes a one dimensional trench pattern.

6. The method of claim 1, wherein the first and second block copolymer material have a natural periodicity value Lo=25 nm lamellae-forming to form line patterning 12.5 nm.

7. The method of claim 1, wherein the first and second block copolymer materials include using combinations of block copolymer materials including two sphere-forming block copolymers for first and second zones, a sphere-forming block copolymer for second zones and a lamellae-forming lines block copolymer for first zones and a lamellae-forming lines block copolymer for both zones.

8. The method of claim 1, wherein the first buffer layer includes chromium and hydrogen silsesquioxane, wherein the first directed self-assembly is used to pattern the first zone in the substrate in an overlay alignment process.

9. The method of claim 1, further comprising applying a coating of a second buffer layer and further applying a second photoresist layer on the imprinted first pattern in the first zone, wherein the applying the coating of the second buffer layer and the applying the second photoresist layer occurs before using the second directed self-assembly to pattern the second zone in the substrate in an overlay alignment process.

10. The method of claim 9, wherein the second buffer includes chromium and hydrogen silsesquioxane.

11. The method of claim 9, wherein the applying the coating of the second buffer layer and the applying the second photoresist layer occurs after using the first directed self-assembly to pattern the first zone in the substrate with the first pattern.

12. The method of claim 1, further comprising processes to trim down thickness of the imprinted first pattern that includes two dimensional dots array imprint before performing the first directed self-assembly in the first zone and to trim down thickness of the imprinted second pattern that includes one dimensional imprint trench before performing the second directed self-assembly in the second zone.

* * * * *